(12) United States Patent
Rahman et al.

(10) Patent No.: US 8,415,783 B1
(45) Date of Patent: Apr. 9, 2013

(54) APPARATUS AND METHODOLOGY FOR TESTING STACKED DIE

(75) Inventors: Arifur Rahman, San Jose, CA (US); Raghunandan Chaware, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 580 days.

(21) Appl. No.: 11/973,245

(22) Filed: Oct. 4, 2007

(51) Int. Cl.
*H01L 23/02* (2006.01)
*H01L 23/34* (2006.01)

(52) U.S. Cl.
USPC ............ 257/686; 257/48; 257/620; 257/678; 257/725; 257/E23.085

(58) Field of Classification Search ............... 257/686, 257/678, E25.01, E25.006, E25.013, E23.085, 257/620, 48, E21.524, 734, 725, 723
See application file for complete search history.

(56) References Cited

U.S. PATENT DOCUMENTS

| | | | |
|---|---|---|---|
| 6,013,534 A * | 1/2000 | Mountain | 438/15 |
| 6,225,396 B1 * | 5/2001 | Watada et al. | 524/492 |
| 6,337,579 B1 | 1/2002 | Mochida | |
| 6,344,401 B1 * | 2/2002 | Lam | 438/460 |
| 6,781,226 B2 | 8/2004 | Huppenthal et al. | |
| 6,875,921 B1 | 4/2005 | Conn | |
| 6,917,219 B2 | 7/2005 | New | |
| 6,930,378 B1 * | 8/2005 | St. Amand et al. | 257/686 |
| 7,084,487 B1 * | 8/2006 | Conn | 257/660 |
| 7,098,542 B1 | 8/2006 | Hoang et al. | |
| 7,223,634 B2 * | 5/2007 | Yamaguchi | 438/108 |
| 7,224,184 B1 * | 5/2007 | Levi et al. | 326/41 |
| 7,233,061 B1 | 6/2007 | Conn | |
| 7,240,315 B1 * | 7/2007 | Wang et al. | 716/10 |
| 7,626,476 B2 * | 12/2009 | Kim et al. | 333/238 |
| 2004/0164390 A1 * | 8/2004 | Wang | 257/686 |
| 2004/0262635 A1 | 12/2004 | Lee | |
| 2005/0023656 A1 * | 2/2005 | Leedy | 257/678 |
| 2005/0046002 A1 * | 3/2005 | Lee et al. | 257/678 |
| 2005/0242422 A1 * | 11/2005 | Klein et al. | 257/686 |
| 2006/0012018 A1 * | 1/2006 | Karnezos et al. | 257/678 |
| 2006/0038272 A1 * | 2/2006 | Edwards | 257/686 |
| 2006/0065977 A1 * | 3/2006 | Bora et al. | 257/734 |
| 2006/0237828 A1 * | 10/2006 | Robinson et al. | 257/678 |
| 2007/0126085 A1 * | 6/2007 | Kawano et al. | 257/621 |
| 2007/0152708 A1 | 7/2007 | Madurawe et al. | |
| 2008/0042140 A1 | 2/2008 | Alam et al. | |

OTHER PUBLICATIONS

Rahman et al. Die Stacking Technology for Terabit Chip-to-chip Communications. IEEE Custom Integrated Circuits Conference, Sep. 10-13, 2006, pp. 587-590.*
Rahman, Die Stacking Technology for Terabit chip-to-chip communication. IEEE 2006 Custom Integrated Circuit Conference, pp. 587-590.*
U.S. Appl. No. 11/973,062, filed Oct. 4, 2007, Rahman et al.
U.S. Appl. No. 12/128,459, filed May 28, 2008, Trimberger al.
U.S. Appl. No. 12/505,215, filed Jul. 17, 2009, Rahman et al.

(Continued)

*Primary Examiner* — Colleen Matthews
*Assistant Examiner* — Galina Yushina
(74) *Attorney, Agent, or Firm* — Scott Hewett; LeRoy D. Maunu

(57) ABSTRACT

A packaged integrated circuit ("IC") has a daughter IC die stacked on a backside of a parent IC die. Backside fill material is applied to the backside of the parent IC die to provide a planarized surface.

18 Claims, 5 Drawing Sheets

OTHER PUBLICATIONS

Baliga, John et al., "Through-Silicon Technology, Applications Growing", Semiconductor International, Mar. 1, 2005, pp. 1-3, available from Semiconductor International, 2000 Clearwater Drive, Oak Brook, IL 60523 or http://www.semiconductor.net.

Garrou, Phillip, "Future ICs Go Vertical", MCNC Research & Development Institute, Feb. 1, 2005, pp. 1-10, available from Semiconductor International, 2000 Clearwater Drive, Oak Brook, IL 60523 or http://www.semiconductor.net.

Guarini, K. W. et al., "Electrical Integrity of State-of-the-Art 0.13 um SOI CMOS Devices and Circuits Transferred for Three-Dimensional (3D) Integrated Circuit (IC) Fabrication", 2002, pp. 943-945, available from IEEE, 3 Park Avenue, 17th Floor, New York, NY 10016-5997.

Ieong, Meikei et al., "Three Dimensional CMOS Devices and Integrated Circuits", 2003, IEEE 2003 Custom Integrated Circuits Conference, pp. 207-213 available from IEEE, 3 Park Avenue, 17th Floor, New York, NY 10016-5997.

U.S. Appl. No. 11/701,807, filed Feb. 1, 2007, Rahman, Arifur et al., "Method and Apparatus for Integrating Capacitors in Stacked Integrated Circuits", 31 pages, available from Xilinx, Inc., 2100 Logic Drive, San Jose, CA 95124.

Rahman, Arifur et al., "Die Stacking Technology for Terabit Chip-to-Chip Communications," pp. 1-4, available from Xilinx, Inc., 2100 Logic Drive, San Jose, CA 95124, www.xilinx.com.

\* cited by examiner

APPARATUS AND METHODOLOGY FOR TESTING STACKED DIE

FIELD OF THE INVENTION

This invention relates generally to integrated circuits, and more particularly to techniques for testing wafers having stacked dice.

BACKGROUND OF THE INVENTION

Many integrated circuits ("ICs") are made up of millions of interconnected devices, such as transistors, resistors, capacitors, and diodes, on a single chip of semiconductor substrate. Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

In some instances, a second IC is stacked on an IC ("stacked IC"). The first and second ICs are electrically connected, and the combination of the two ICs is packaged and used as a single component. The second IC could be a read-only memory, random access memory, a processor, or an application specific IC (ASIC), for example. The front side of the second IC is typically attached to the backside of the first IC, and the ICs are electrically connected to each other using solder bumps, backside pads, and through vias (i.e., vias that extend through the first IC to electrically connect a pad on the backside of the first IC with a pad or solder bump on the front side of the first IC). The first (parent) IC is designed to interface with the second (daughter), which might be a standard component or a component specifically designed to interface with the parent IC. Stacked ICs are singulated from the wafer as dice and electrically tested before being packaged, such as by using a flip-chip package technique.

Yield loss arising from the die stacking process often occurs. Testing stacked IC wafers avoids processing the failed stacked IC chips into packaged ICs Depending on the specification of die-stacking technology (via pitch, aspect ratio, density, etc.), we have less than 100% yield during stacking. So, we need to test the stacked-die interface before packaging. It is possible that the stacked die might need to be tested for speed. It is desirable to provide techniques for testing wafers having stacked ICs.

SUMMARY OF THE INVENTION

A packaged integrated circuit ("IC") has a daughter IC die stacked on a backside of a parent IC die to form a stacked IC. Backside fill material is applied on the backside of the parent IC die and provides a planarized surface. In a particular embodiment, the stacked IC is attached to a package substrate and encapsulated.

In another embodiment, an integrated circuit ("IC") wafer is fabricated by fabricating a parent wafer having parent ICs. The parent wafer is tested to identify a good parent IC, and a daughter die is stacked on the backside of the parent wafer. The daughter die is electrically coupled to the parent IC to form a stacked IC. Typically, many daughter dice are stacked on several good parent ICs of the parent wafer to form a stacked wafer.

A backside fill material is applied to the backside of the parent wafer so as to cover the daughter dice. In some embodiments, the backside fill material forms a flat surface over the daughter dice that provides a surface suitable for holding the stacked wafer in a vacuum chuck. In other embodiments, the backside fill material is planarized to form a planarized surface suitable for holding the stacked wafer in a vacuum chuck. The stacked wafer is tested using a vacuum wafer test stage.

DETAILED DESCRIPTION OF THE DRAWINGS

Figure 1:
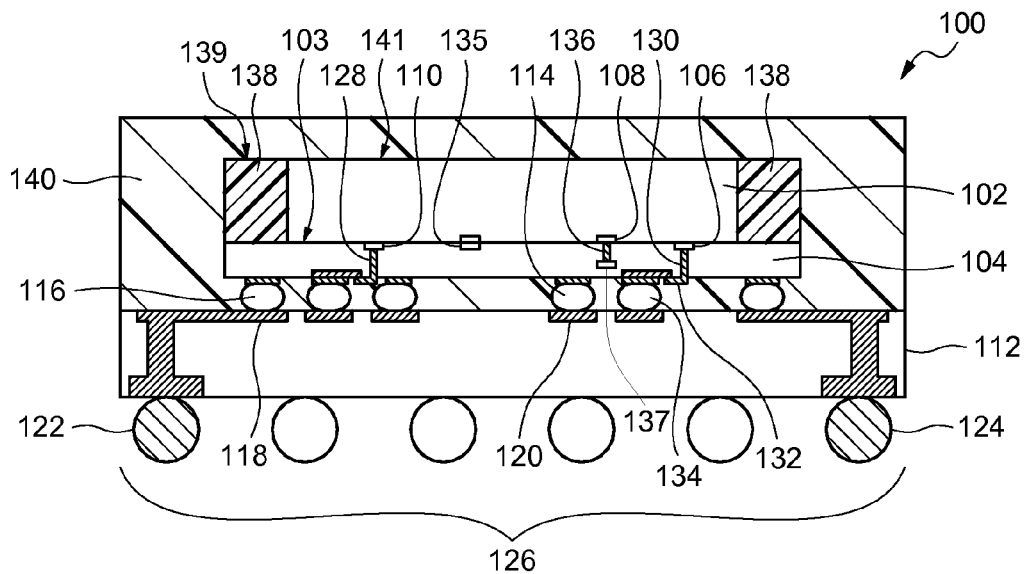
FIG. 1 is a cross section of a packaged stacked IC according to an embodiment of the present invention.

FIG. 1 is a cross section of a packaged stacked IC 100 according to an embodiment. The stacked IC includes a daughter die 102 stacked on a backside of a parent die 104 and electrically connected to the parent die 104. The daughter die 102 is a RAM chip, a ROM chip, a processor chip, a co-processor chip, an ASIC chip, or other IC chip, and is attached to the parent chip 104 with electrical connections 106, 108, 110, which in a particular embodiment are micro-bumps (e.g., 25 micron pitch micro-bumps) of solder or other conductor that are electrically coupled to conductive pads or vias on the parent chip. Several stacked interconnect techniques are known in the art, and any such suitable interconnect techniques are alternatively used. In some embodiments, the electrical connections also provide a mechanical connection. In alternative embodiments, an adhesive material or dummy solder or eutectic joints are used to more securely attach the stacked dice together. In a particular embodiment, the front side of the daughter die 102 is connected to the backside of the parent die; however, the terms "front" and "back" are used only for purposes of convenient discussion, and other orientations could be used. A front-to-back attachment is particularly useful for flip-chip applications.

The parent die 104 is electrically coupled to a package substrate 112 with balls 114, 116 (shown without hatching for clarity of illustration) connected to pads 118, 120 on the package substrate 112. In a particular embodiment, the balls 114, 116 are C4 bumps on a 200 micron to 250 micron pitch. Other suitable techniques are alternatively used. Solder balls 122, 124 of a ball grid array 126 (additional solder balls are shown in side view without hatching) on the opposite side of the package substrate 112 are used to attach the packaged stacked IC 100 to a printed wiring board (not shown) and provide package contacts to electrically access the packaged ICs. Alternatively, the backside of the daughter die is attached to the backside of the parent die and wire bonds or through-die vias (also known as through-silicon vias or TSVs) in the daughter die are used to electrically interconnect the stacked dice. When used in reference to an IC die, the term "front side" refers to the side nearest the topmost (last) metal layer, and the term "backside" refers to the opposite side of the IC.

The daughter die 102 is connected through the parent die 104 and package substrate 112 so that pads (ports) of the daughter die 102 are directly accessible from a ball (contact) on the package substrate. Alternatively or additionally, ports of the daughter die are not directly accessible from the ball grid array on the bottom of the package substrate, but are connected through the fabric of the parent die 104, which in a particular embodiment if an FPGA. For example, the daughter die 102 is a RAM which is connectable to logic of the FPGA, but not directly accessible from the ball grid array 126 on the package substrate 112. In other words, the parent die 104 has to be active (biased) to access the daughter die 102.

Pads of the daughter die 102 are connected to pads of the parent die and through a variety of conductive structures. Through-die vias 128, 130 are conductive features extending from one side (e.g., the front side) of the parent die 104 to the opposite (e.g., the back side) of the parent die 104. A trace 132 connects the through-die via 130 to solder ball 134, which is offset (i.e., not directly beneath) the through-die via. The through-die vias 128, 130 are shown as being connected directly to pads on the back side of the parent die, but could be similarly offset from the backside. Another pad of the daughter die 102 is connected to a trace or pad 135 formed on the backside of the parent die 104. Another pad of the daughter die is connected to a via 136 that is not a through-die via, but that extends to an intermediate metal layer 137 of the parent die. In a particular embodiment where the parent die is a programmable logic device, such as an FPGA, the pad of the daughter die is selectively routed through the fabric of the FPGA to a package contact (e.g., a ball of the ball grid array 126).

Backside fill material 138 on the backside 103 of the parent die 104 is adjacent to the sides of and surrounds the daughter die 102. The backside fill material is cured polymer resin-based, thermoplastic material, or thermosetting material, which is filled with filler particles or is alternatively unfilled. In a particular embodiment, the backside fill material is a molding compound, such as a glass/silica-filled epoxy resin. The backside fill material 138 is added to the parent die wafer after daughter chips have been attached (see FIGS. 2A-2D) and is planarized to form a planarized surface 139. The planarized surface 139 is the same height as the top 141 of the daughter die. In alternative embodiments, backside fill material is only on one, two or three sides (i.e., does not surround) the daughter die. In other embodiments, the backside fill material is also on top of the daughter die. In other words, the planarization of the backside fill material does not remove all of the material from the stacked dice. In yet other embodiments, multiple daughter dice are attached to a parent die, by similar or various techniques, or dummy silicon (i.e., non-electrically active silicon that acts essentially as a spacer) is attached to the backside of the parent die, along with one or more daughter dice.

Packaging encapsulant 140 covers at least the stacked dice. Packaging encapsulant is a molding compound, for example, several of which are commercially available and are currently used to form conventional packaged ICs. In alternative embodiments, the packaging encapsulant does not extend to the outer perimeter of the packaging substrate 112. In another embodiment, the daughter and mother die is underfilled with an epoxy, cyanate ester, or acrylate-based systems. The packaging encapsulant 140, then covers the stacked dice. This packaging encapsulant optionally includes material to enhance thermal conductivity.

Figure 2A:
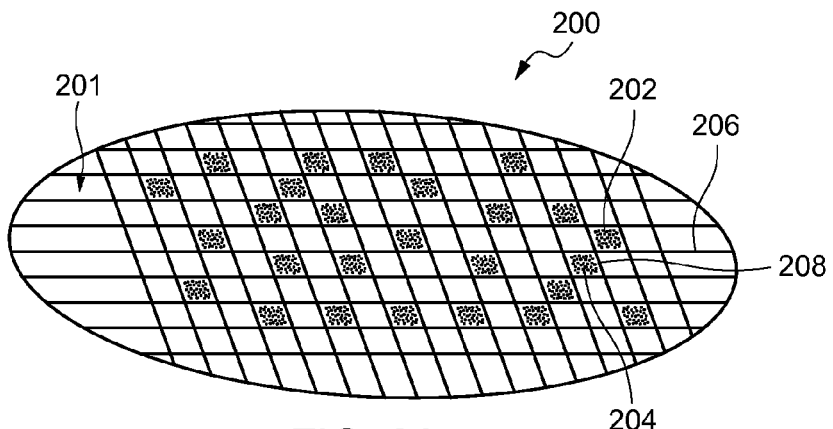
FIG. 2A is an isometric view of a backside of a wafer having parent ICs.

FIG. 2A is an isometric view of a frontside 201 of a wafer 200 having parent ICs 202, 204 between alleys 206, 208 that form a grid. The wafer 200 is referred to as a "parent wafer", or simply "wafer". The ICs will be singulated from the wafer 200 in a sawing or scribing operation. It is desirable to electrically test the ICs before singulating them from the wafer. This is typically done using probes, such as on a probe card, at an electronic test station. The ICs are stepped through the probe station and a series of electrical tests are performed to determine whether an IC passes. If an IC fails, that location in the grid (i.e., that IC) is inked or its location is recorded and failed ICs are separated from good ICs after singulation. In the example of FIG. 2A, good ICs are indicated with a stippling pattern for purposes of illustration. It is also desirable to physically inspect the wafer and reject ICs based on failing visual or other inspection. Good ICs (i.e., ones suitable for die stacking) pass wafer test and inspection.

While daughter dice could be stacked on good parent dice after singulation and binning, it is desirable to stack daughter dice on known good ICs of the wafer, as the wafer is much larger than a single die and handling and registration is easier. Applying daughter dice to the known good mother ICs on a wafer also allows the stacked dice to be bonded together in a single operation, thus streamlining the product flow.

Wafer level stacking also requires less pick-and-place machine time because only the daughter dice that will be placed on known good mother dice need to be picked. Picking and placing both daughter and mother dice essentially doubles the machine time for pick and place. Wafer level stacking and testing reduces cost and improves throughput.

Figure 2B:
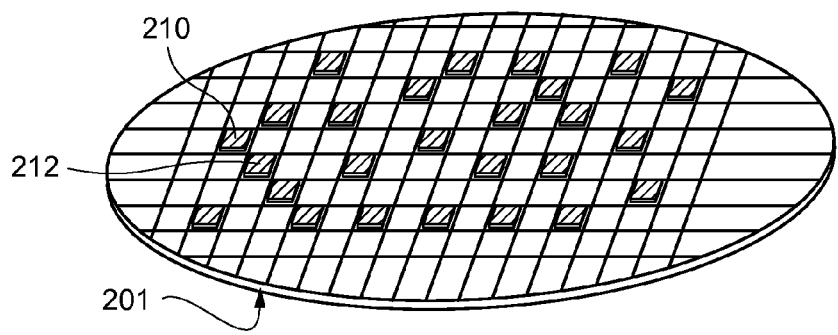
FIG. 2B is an isometric view of the backside of the wafer of FIG. 2A after daughter dice have been stacked on known good locations of parent ICs.

FIG. 2B is an isometric view of the backside of the wafer of FIG. 2A after daughter dice 210, 212 have been stacked on known good locations of parent ICs. The backside (see FIG. 3A, ref. num. 203) is opposite the frontside 201 of the wafer. The alleys are shown on the backside of the wafer for purposes of illustration. Although the alleys might not be visible on the actual backside of the wafer, the locations of the good ICs of the wafer are known from the wafer test records. Generally, the wafer is registered so that the grid locations of the ICs are easily determined. Fine registration of the daughter dice to the parent wafer is done according to the through-die vias or other bonding sites on the backside of the parent ICs. Techniques for stacking daughter dice on a parent wafer are described in further detail in commonly owned U.S. patent application entitled "Integrated Circuit With Through-Die Via Interface For Die Stacking", filed simultaneously with the present Application, by Steven Trimberger, Bernie New, and Arifur Rahman, the disclosure of which is hereby incorporated by reference in its entirety for all purposes.

In an alternative embodiment, the daughter dice are substantially smaller that the parent ICs. In further embodiments, multiple daughter dice are stacked on a single parent IC. The multiple dice stacked on a single IC are all of the same type of IC, for example, each of the multiple dice are RAM chips, or are different types of ICs, such as one daughter die being a RAM chip and another daughter die being a flash memory chip, a ROM chip or a processor chip.

Figure 2C:
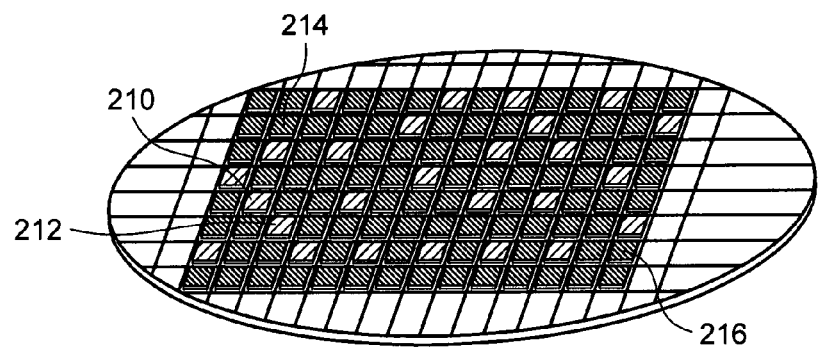
FIG. 2C is an isometric view of the backside of the wafer of FIG. 2B after dummy dice have been attached to the backside on failed parent ICs.

FIG. 2C is an isometric view of the backside of the wafer of FIG. 2B after dummy dice 214, 216 have been attached to the backside on failed parent ICs (compare FIG. 2A). The dummy dice are silicon chips having essentially the same height as the daughter dice. Alternatively, the dummy dice are thicker or thinner than the daughter dice. Dummy dice that are thicker than the daughter dice serve as stops in a backside fill planarization process (see FIGS. 2D, 3F), which leaves a layer of backside fill material on the daughter dice (compare, FIG. 1), but avoids removing material from the daughter dice in the planarization process.

Dummy dice are not used in all applications. For example, if a wafer had a high proportion of known good ICs, the population of stacked daughter dice is sufficient for the backside fill and planarization process.

Figure 2D:
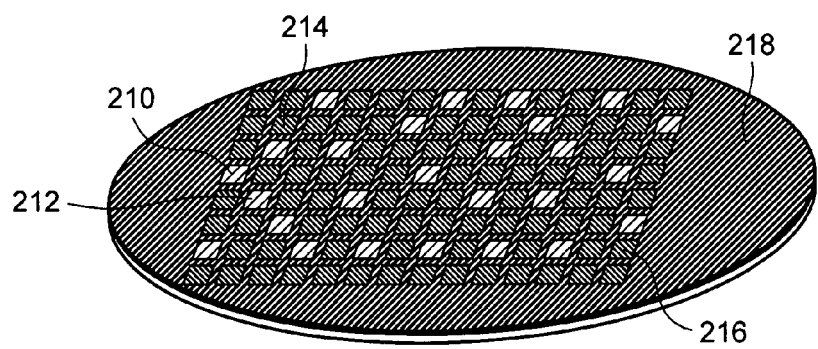
FIG. 2D is an isometric view of the backside of the wafer of FIG. 2C after filler has been applied and planarized.

FIG. 2D is an isometric view of the backside of the wafer of FIG. 2C after backside filler 218 has been applied and planarized. The backside filler fills in the spaces between the daughter dice 210, 212 and the dummy dice (e.g. dummy die 216). In an alternative, dummy dice are omitted, and the backside filler fills in the spaces between daughter dice. In other embodiments, multiple daughter dice are stacked on a single IC of the parent wafer.

In a particular embodiment, the backside filler is glass-filled epoxy, such as is commonly used as an IC molding compound. In some applications, it is desirable to include silica or silicon fill material in the resin to adjust the coefficient of thermal expansion of the backside fill material to that of the parent wafer. In a particular embodiment, the backside fill material has between 80 volume percent and 90 volume percent silica fill in an epoxy matrix. Suitable polymers for the backfill or encapsulation composition include thermosets and thermoplastics including epoxy, polyamide, phenoxy, polybenzoxazine, acrylate, cyanate ester, bismaleimide, polyether sulfone, polyimide, benzoxyzene, vinyl ether, siliconized olefin, polyolefin, polybenzoxyzole, polyester, polystyrene, polycarbonate, polypropylene, poly(vinyl chloride), polyisobutylene, polyacrylonitrile, poly(methyl methacrylate), poly(vinyl acetate), poly(2-vinylpridine), cis-1,4-polyisoprene, 3,4-polychloroprene, vinyl copolymer, poly(ethylene oxide), poly(ethylene glycol), polyformaldehyde, polyacetaldehyde, poly(b-propiolacetone), poly(10-decanoate), poly(ethylene terephthalate), polycaprolactam, poly(11-undecanoamide), poly(m-phenylene-terephthalamide), poly(tetramethlyene-m-benzenesulfonamide), polyester polyarylate, poly(phenylene oxide), poly(phenylene sulfide), polysulfone, polyimide; polyetheretherketone, polyetherimide, fluorinated polyimide, polyimide siloxane, polyiosindolo-quinazolinedione, polythioetherimide poly-phenyl-quinoxaline, polyquuinixalone, imide-aryl ether phenylquinoxaline copolymer, polyquinoxaline, polybenzimidazole, polybenzoxazole, polynorbornene, poly(arylene ethers), polysilane, parylene, benzocyclobutenes, hydroxy (benzoxazole) copolymer, poly(silarylene siloxanes), and polybenzimidazole. Other suitable materials for making hot-melt compositions include rubber polymers such as block copolymers of monovinyl aromatic hydrocarbons and conjugated diene, e.g., styrene-butadiene, styrene-butadiene-styrene (SBS), styrene-isoprene-styrene (SIS), styrene-ethylene-butylene-styrene (SEBS), and styrene-ethylene-propylene-styrene (SEPS). Other suitable materials for making coating or back-fill materials include ethylene-vinyl acetate polymers, other ethylene esters and copolymers, e.g., ethylene methacrylate, ethylene n-butyl acrylate and ethylene acrylic acid; polyolefins such as polyethylene and polypropylene; polyvinyl acetate and random copolymers thereof; polyacrylates; polyamides; polyesters; and polyvinyl alcohols and copolymers thereof.

Curable resins in solid or liquid form can be used. Solid resins are mixed with a solvent to facilitate the application process. One such example of solid resin is aromatic bismaleimide resin. Suitable epoxy resins include bisphenol, naphthalene, and aliphatic type epoxies. Suitable resins that are available in liquid form include epoxies, acrylates or methacrylates, maleimides, vinyl ethers, polyesters, poly(butadienes), siliconized olefins, silicone resins, styrene resins and cyanate ester resins.

Planarization typically involves a mechanical removal of backside fill material using a grinding or polishing technique down to the stacked dice. Alternatively, planarization of the backside fill material is stopped when a suitably planar surface is obtained before the daughter or dummy dice are exposed.

In one embodiment, the parent wafer is thinned after IC fabrication to a thickness less than about 100 microns. Wafer thinning is particularly desirable for FPGAs because it reduces the thermal resistance and thermal mass of the IC, it allows exposure of through-die vias to electrical contact, and because FPGAs can dissipate significant power during operation, often much more than memory ICs, for example. If the daughter dice are significantly thicker than the parent wafer (e.g., if the wafer from which the daughter dice are singulated is not thinned), the stacked ICs might warp after singulation from the wafer, typically warping towards the active (front) side of the parent die. The coefficient of thermal expansion of the backside fill material is selected in some embodiments, such as when the daughter die is thicker than the parent die, to counter warping of the stacked die. This facilitates subsequent handling operations by maintaining flatness of the stacked wafer.

The planarized backside provides a flat surface suitable for securing the stacked wafer in a vacuum stage for electrically testing the stacked ICs of the wafer ("wafer test"). Vacuum stages are frequently used for wafer test, and typically have concentric grooves or other channels in a flat stage. When a standard wafer is placed on the stage and a vacuum is applied to the grooves, the wafer is securely held and electrical probes are applied to test contacts on the wafer. In a typical application, the vacuum stage is stepped in a periodic fashion and electric testing is done on several ICs of the wafer in a serial fashion. If a stacked wafer without planarized backside fill were to be placed on a conventional vacuum stage, the gaps between the daughter dice would likely prevent a secure vacuum attachment of the stacked wafer to the stage. Planarizing backside fill material applied to a stacked wafer allows testing of the stacked wafer in conventional wafer test stations.

Figure 3A:
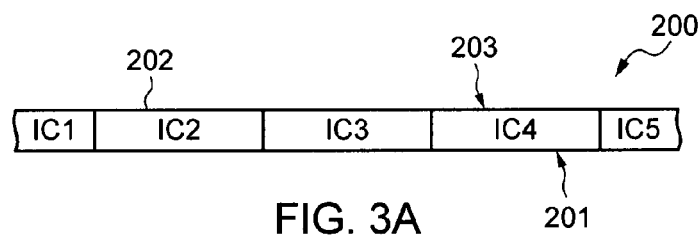
FIG. 3A is a cross section of a portion of the wafer shown in FIG. 2A.
Figure 3B:
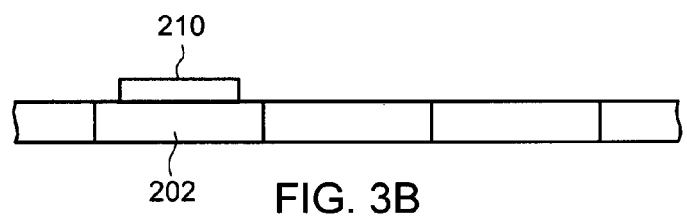
FIG. 3B is a cross section of a portion of the wafer shown in FIG. 2B.

FIG. 3A is a cross section of a portion of the wafer 200 shown in FIG. 2A taken through the row containing IC 210. FIG. 3A is inverted from FIG. 2A, that is, the front side 201 is oriented toward the bottom of the view and the backside 203 is oriented toward the top of the view. IC 202 is a known good IC, while the other ICs in this portion of the row failed wafer test of the parent wafer. FIG. 3B is a cross section of a portion of the wafer shown in FIG. 2B. A daughter die 210 is stacked on IC 202.

Figure 3C:
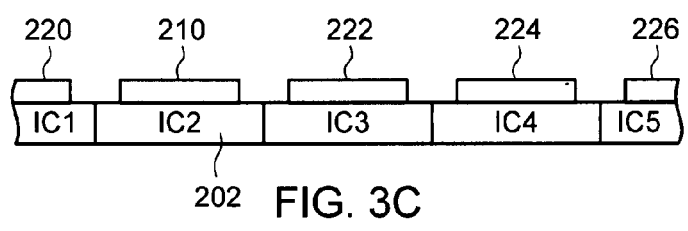
FIG. 3C is a cross section of a portion of the wafer shown in FIG. 2C.

FIG. 3C is a cross section of a portion of the wafer shown in FIG. 2C. Dummy silicon dice 220, 222, 224, 226 have been attached to the backsides of IC1, IC3, IC4 and IC5, which failed either wafer electrical test or physical inspection. In a particular embodiment, the dummy silicon dice are failed daughter dice. Dummy dice can be blank silicon dice of same footprint as functional daughter dice. The dummy silicon dice are there to fill in the voids in between functional daughter dice to improve manufacturability.

Figure 3D:
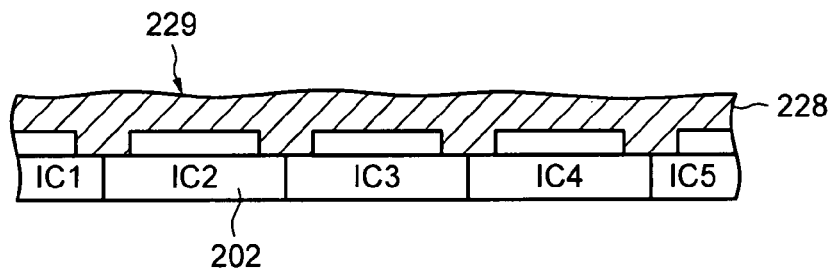
FIG. 3D is a cross section of the portion of the wafer shown in FIG. 3C after backside filler has been applied.

FIG. 3D is a cross section of the portion of the wafer shown in FIG. 3C after backside filler 228 has been applied. Although backside filler is often applied in a fluid state, the exposed surface 229 is uneven and would not form a suitable vacuum seal when the wafer is placed on a vacuum stage for wafer test.

Figure 3E:
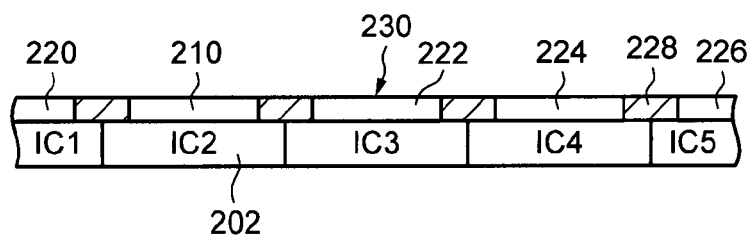
FIG. 3E is a cross section of the portion of the wafer shown in FIG. 3D after planarization in accordance with an embodiment of the present invention.

FIG. 3E is a cross section of the portion of the wafer shown in FIG. 3D after planarization. A planarized surface 230 is formed by the planarization process, which is a grinding or polishing process. In a particular embodiment, a conventional backlapping process is used. Wet etching or dry etching techniques are alternatively used. The planarized surface, includes portions of backside fill material 228, portions of exposed daughter IC 210 and portions of exposed dummy chips 220, 222, 224, 226. Alternatively, a planarized surface includes portions of backside fill material, portions of exposed daughter chips, portions of backside fill material and portions of exposed dummy chips (such as when the dummy chips are thicker than the daughter chips), or only backside fill material, such as when the planarization process is stopped before daughter chips or dummy chips are exposed.

Figure 3F:
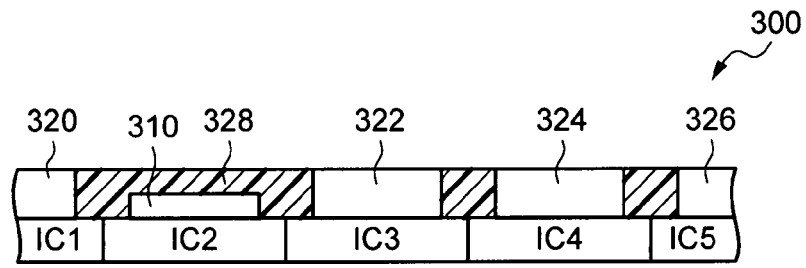
FIG. 3F is a cross section of a portion of a stacked wafer according to another embodiment of the present invention.

FIG. 3F is a cross section of a portion of a stacked wafer 300 according to another embodiment. Dummy dice 320, 322, 324, 326 are thicker than the daughter die 310. Planarization is taken down to the dummy dice 320, 322, 324, 326, which leaves a layer of backside fill material 328 above the daughter die 310. Thus, no material is removed from the daughter die 310 during the planarization process, even if small amount of run-out occurs during planarization.

Figure 4:
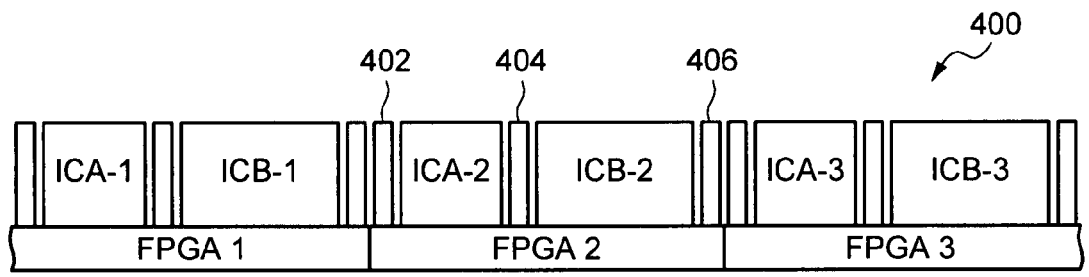
FIG. 4 is a cross section of a portion of a stacked wafer according to another embodiment of the present invention.

FIG. 4 is a cross section of a portion of a stacked wafer 400 according to another embodiment. Silicon fills 402, 404, 406 are attached to a parent die FPGA 2 along with stacked daughter IC chips IC A-2, IC B-2. The silicon fills are portions of scrap ICs, portions of unprocessed silicon wafers, including polysilicon wafers, placed on edge, portions unprocessed silicon wafers, including polysilicon wafers, singulated into fills, or unused portions of wafers used to fabricate the daughter IC(s), for example. The silicon fills improve heat removal from the parent IC, and are particularly desirable for use with FPGA parent ICs because of the power consumption of FPGAs, compared to a RAM daughter chip, for example.

Figure 5:
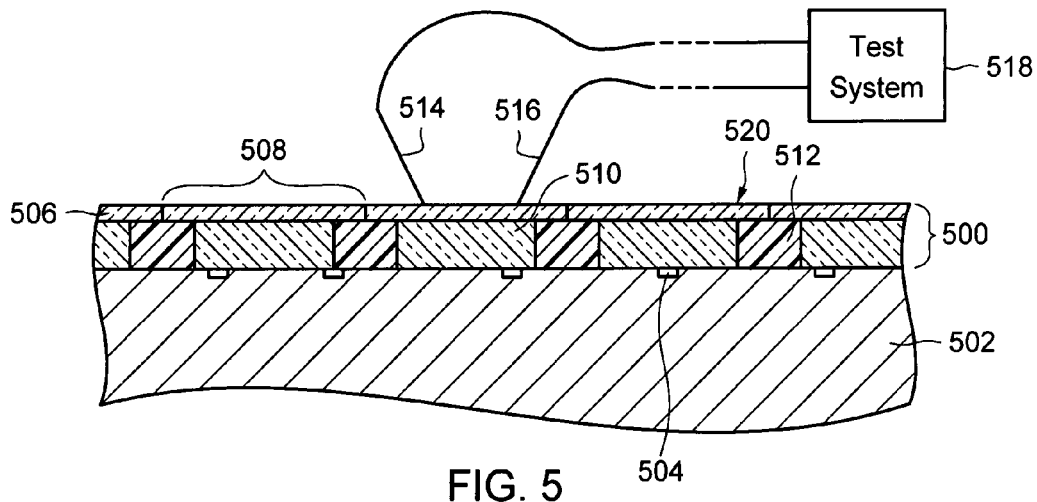
FIG. 5 is a side view of a stacked wafer being probed during electrical test according to an embodiment of the present invention.

FIG. 5 is a side view of a stacked wafer being probed during electrical test according to an embodiment. A stacked wafer 500 is secured to a vacuum stage 502 that has vacuum channels 504. Vacuum stages are well known in the art of wafer test and further description is therefore omitted. The stacked wafer 500 includes a parent wafer 506 that has several parent ICs (e.g., parent IC 508) built therein. Lines separating the parent ICs are shown for purposes of illustration and discussion and are not part of the physical parent wafer, but indicate where the ICs will be singulated from the wafer. The stacked wafer 500 also includes one or more daughter ICs 510 that have been stacked on known good parent ICs, and backside fill portions 512. The backside of the parent wafer is planarized as described above in reference to FIG. 3E and provides a surface suitable for using the vacuum stage 502 to test the stacked wafer 500. Alternatively, the applied backside fill material forms a suitably planar surface without a subsequent planarization (material removal) step.

Test probes 514, 516 contact test points (not specifically shown) on the front surface 520 of the stacked wafer 500 and electrically connect the test points of the stacked wafer to a test system 518. Additional probes are usually present but not shown for clarity of illustration. Electrical testing of IC wafers using probes or other techniques is well known, and further description is therefore omitted. The daughter chip 510 through the parent chip to allow wafer testing of the stacked wafer 500. Wafer testing of stacked wafers differentiates between good stacked ICs (i.e., those that pass stacked wafer test) and bad stacked ICs. Even though known good daughter dice are stacked on known good parent ICs, a defect in the stacking process can occur that renders the stacked IC unsuitable. When the stacked wafer is singulated, the good stacked dice are separated from the bad stacked dice, and the good stacked dice are packaged (see FIG. 1). In a further embodiment, the backside fill is removed after stacked wafer test, either before or after singulation, and backside fill is not incorporated into the final packaged stacked IC.

Figure 6:
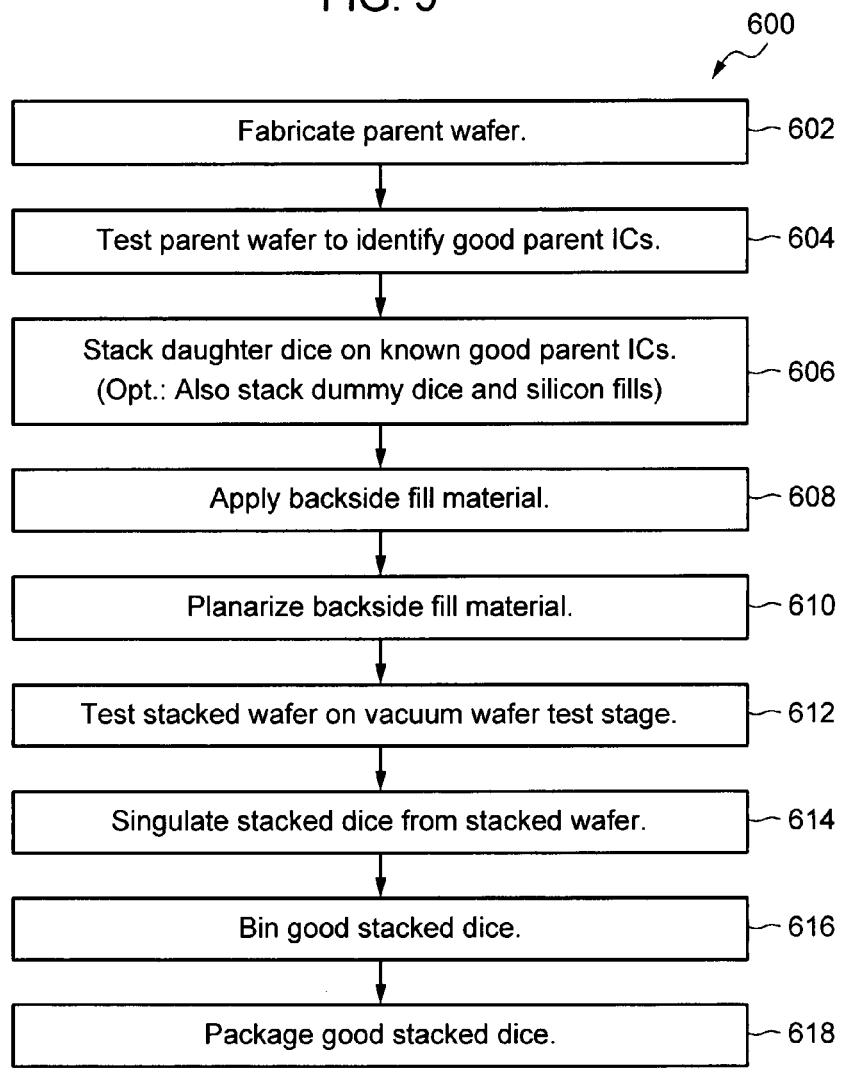
FIG. 6 is a flow chart of a method of fabricating a stacked IC wafer according to an embodiment of the present invention.

FIG. 6 is a flow chart of a method 600 of fabricating a stacked IC wafer according to an embodiment. A parent wafer having parent ICs defined therein is fabricated (step 602). In a particular embodiment, the parent wafer is thinned to between about 50 microns and 100 microns. The parent wafer is wafer tested to identify good parent ICs (step 604). At least one (tested) known good daughter die is stacked (attached and electrically coupled) to the backside of the parent wafer to form a stacked wafer with a stacked IC having a known good parent IC (step 606). In a further embodiment, dummy dice are also attached to the backside of the parent wafer at locations other than known bad parent ICs. In a yet further embodiment, the dummy dice create a uniform back plane with the daughter dice. In an alternative or further embodiment, silicon fills are attached to the known good parent IC in addition to one or more daughter ICs. In a further embodiment, passive components are stacked on the backside of the parent IC.

Backside fill material is applied to the backside of the parent wafer so as to cover the daughter die (step 608) and to create a planar surface. In a particular embodiment, the backside fill material is silica or silicon filled epoxy molding compound having a coefficient of thermal expansion comparable to the parent wafer, which is a silicon wafer in a particular embodiment, but other types of wafers are alternatively used. The backside fill material is planarized (step 610) to provide a flat, contiguous surface suitable for use on a vacuum stage. Alternatively, the applied backside fill material forms a flat contiguous surface (i.e., a planarized surface) suitable for use on a vacuum stage without the planarization step 610. In a particular embodiment, the backside fill material is planarized to expose the backside of the dummy or daughter dice. Alternatively, the backside fill material is planarized without exposing dummy or daughter dice. In a further embodiment, the stacked wafer is placed on a vacuum stage of a wafer test station and the stacked wafer is tested (step 612).

The stacked wafer test tests the daughter die-parent IC interface before the stacked wafer is singulated, and identifies the good stacked ICs. The stacked wafer is singulated into dice (step 614) and the good stacked dice are separated (binned) from the remainder of the singulated wafer (step 616). The good stacked ICs are then packaged (step 618). In a particular embodiment, the good stacked ICs are attached to a package substrate and molding compound is formed over the stacked dice.

Figure 7:
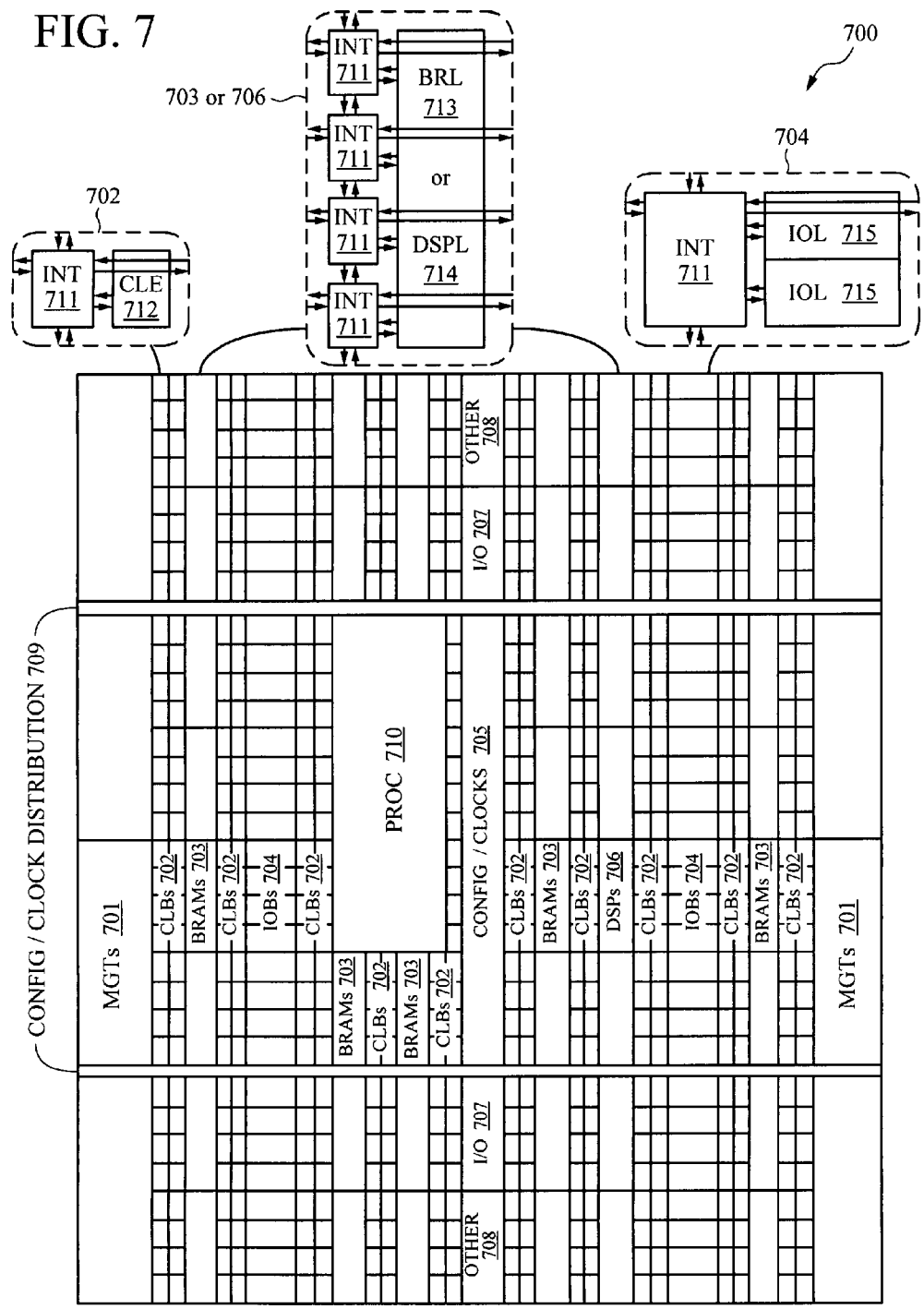
FIG. 7 is a plan view of an FPGA according to an embodiment of the present invention.

FIG. 7 is a plan view of an FPGA 700 according to an embodiment. The FPGA includes CMOS portions in several of the functional blocks, such as in RAM and logic, and is fabricated using a CMOS fabrication process. A daughter die (not shown) is stacked on the backside of the FPGA 700 and backside fill material provides a flat backside surface of the stacked FPGA according to an embodiment of the invention. Additional daughter dice are alternatively stacked on the backside of the FPGA. In a further embodiment, silicon fills are also stacked on the backside of the FPGA.

The FPGA architecture includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 are manufactured using metal layered above the various illustrated logic blocks, and typically are not confined to the area of the input/output logic element 715. In the pictured embodiment, a columnar area near the center of the die is used for configuration, clock, and other control logic.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. Therefore, the spirit and scope of the appended claims should not be limited to the foregoing description.

What is claimed is:
1. A testable wafer structure, comprising:
a wafer having a plurality of parent integrated circuit (IC) dice formed thereon;
wherein each parent IC die has a front side, a backside, and a via extending to a pad on the backside of the parent IC die;
a plurality of daughter IC dice, each daughter IC die being stacked on the backside of a respective one of the parent IC dice and electrically connected to the one of the parent IC dice through the pad of the one of the parent IC dice;
a plurality of silicon wafer portions, each wafer portion disposed on edge on the backside of a respective one of the plurality of parent IC dice, and further disposed between adjacent ones of the daughter dice; and
backside fill material disposed on the backsides of the plurality of parent IC dice on the wafer, wherein the backside fill material in areas between a plurality of pairs of the plurality of daughter dice forms a continuous planar surface.

2. The testable wafer structure of claim 1 wherein the via is a through via extending from the front side of the parent IC die to the backside of the parent IC die.

3. The testable wafer structure of claim 1 wherein the daughter IC die is electrically connected to the pad of the parent IC die with a micro bump.

4. The testable wafer structure of claim 1 wherein the parent IC die is a field programmable gate array ("FPGA") die and the via extends to an intermediate metal layer of the FPGA die.

5. The testable wafer structure of claim 1 wherein the backside fill material comprises molding compound.

6. The testable wafer structure of claim 1 wherein the backside fill material comprises between eighty volume percent and ninety volume percent silica fill in an epoxy matrix.

7. The testable wafer structure of claim 1 further comprising a second plurality of daughter IC dice, each daughter IC die of the second plurality being stacked on the backside of a respective one of the plurality of parent IC dice.

8. The testable wafer structure of claim 1, wherein each of the plurality of daughter IC dice is thicker than each of the plurality of parent IC dice.

9. The testable wafer structure of claim 1, wherein the continuous planar surface formed by the backside fill material is continuously planar with tops of the plurality of daughter IC dice.

10. A testable wafer structure, comprising:
  a wafer having a plurality of parent integrated circuit (IC) dice formed thereon;
  wherein each parent IC die has a front side, a backside, and a via extending to a pad on the backside of the parent IC die;
  a plurality of daughter IC dice, each daughter IC die being stacked on the backside of a respective one of the parent IC dice and electrically connected to the parent IC die through the pad;
  a plurality of silicon wafer portions, each wafer portion disposed on edge on the backside of a respective one of the plurality of parent IC dice, and further disposed between adjacent ones of the daughter dice;
  one or more dummy dice attached to the backsides of one or more of the parent IC dice, respectively; and
  backside fill material disposed on the backsides of the plurality of parent IC dice on the wafer, wherein the backside fill material in areas between a plurality of pairs of the plurality of daughter dice forms a continuous planar surface with tops of the one or more dummy dice.

11. The testable wafer structure of claim 10, wherein the one or more dummy dice are thicker than the daughter dice.

12. The testable wafer structure of claim 10, wherein the one or more dummy dice are thinner than the daughter dice.

13. The testable wafer structure of claim 10, wherein the one or more dummy dice are equal in thickness to the daughter dice.

14. The testable wafer structure of claim 10, further comprising a second plurality of daughter IC dice, each daughter IC die of the second plurality stacked on the backside of a respective one of the plurality of parent IC dice.

15. A testable wafer structure, comprising:
  a wafer having a plurality of parent integrated circuit (IC) dice formed thereon;
  wherein each parent IC die has a front side, a backside, and a via extending from an intermediate metal layer of the parent IC die to a pad on the backside of the parent IC die;
  a plurality of daughter IC dice, each daughter IC die being stacked on the backside of a respective one of the parent IC dice and electrically connected to the one of the parent IC dice through the pad of the one of the parent IC dice;
  a plurality of silicon wafer portions, each wafer portion disposed on edge on the backside of a respective one of the plurality of parent IC dice, and further disposed between adjacent ones of the daughter dice; and
  backside fill material disposed on the backsides of the plurality of parent IC dice on the wafer, wherein the backside fill material in areas between a plurality of pairs of the plurality of daughter dice forms a continuous planar surface.

16. The testable wafer structure of claim 15, wherein the pad is disposed between the backside of the parent IC die and a front side of the daughter IC die.

17. The testable wafer structure of claim 15, further comprising a silicon fill disposed on the backsides of the parent IC dice.

18. The testable wafer structure of claim 15, further comprising a second plurality of daughter IC dice, each daughter IC die of the second plurality stacked on the backside of a respective one of the plurality of parent IC dice.

* * * * *